United States Patent [19]
Alpay

[11] Patent Number: 5,230,971
[45] Date of Patent: Jul. 27, 1993

[54] PHOTOMASK BLANK AND PROCESS FOR MAKING A PHOTOMASK BLANK USING GRADUAL COMPOSITIONAL TRANSITION BETWEEN STRATA

[75] Inventor: Hakki U. Alpay, Highland, N.Y.

[73] Assignee: E. I. Du Pont de Nemours and Company, Wilmington, Del.

[21] Appl. No.: 742,245

[22] Filed: Aug. 8, 1991

[51] Int. Cl.$^5$ .............................................. G03F 9/00
[52] U.S. Cl. ................................... 430/5; 427/448
[58] Field of Search ........................... 430/5; 427/34

[56] References Cited

U.S. PATENT DOCUMENTS

| | | | |
|---|---|---|---|
| 4,363,846 | 12/1982 | Kaneki | 430/5 |
| 4,374,912 | 2/1983 | Kaneki et al. | 430/5 |
| 4,720,442 | 1/1988 | Shinkai et al. | 430/5 |

Primary Examiner—Marion E. McCamish
Assistant Examiner—Mark A. Chapman

[57] ABSTRACT

A single pass, multiple target, continuous sputtering process for manufacturing photomask blanks comprising a single masking layer having plural strata of different composition and gradual compositional transitions between strata. Photomask blanks are useful in the process of integrated circuit manufacture.

10 Claims, 2 Drawing Sheets

5,230,971

PHOTOMASK BLANK AND PROCESS FOR MAKING A PHOTOMASK BLANK USING GRADUAL COMPOSITIONAL TRANSITION BETWEEN STRATA

FIELD OF THE INVENTION

The invention relates to photomask blanks and a process for making them. More specifically, the invention relates to a single pass, multiple target coating process and the photomask blanks produced by such process.

BACKGROUND OF THE INVENTION

In the production of semiconductor devices such as integrated circuits, circuit patterns are formed on silicon wafers by optical or electron beam lithography. A photomask, comprising a patterned opaque film on a transparent substrate, serves as the circuit pattern template in the lithography process.

Current trends in the semiconductor industry are towards increased circuit pattern density on the silicon wafers. As the circuit pattern density is increased, the permissible defect size and density on the photomask necessarily decrease. This decrease translates into fewer and smaller permissible defects in the photomask blank, a substrate having an opaque film thereon, from which the photomask is formed.

A primary source of defects in photomask blanks is the blank manufacturing process. Conventional photomask blanks include two or more different masking layers on the transparent substrate. A light blocking chrome or chrome-based layer and a chrome oxide antireflective layer are the basic masking layers. Additional layers such as further antireflective layers, etch rate enhancing layers and adhesion promoting layers are also used.

Typically, each masking layer is coated individually in separate coating operations. This is done, for example, by sputtering a chrome layer on an uncoated substrate in a sputter chamber, then removing the chrome coated substrate from the chamber, altering the conditions in the chamber to create a chrome oxide sputtering atmosphere and then subjecting the chrome coated substrate to the new conditions. This type of process has some disadvantages. Between coating the different layers, the coating surface is susceptible to contamination. The contamination may be in the form of solid particulates created by mechanical removal and return of the substrate from and to the chamber, or solid residue, particles or dust remaining in the chamber from the previous sputtering conditions. Moreover, the contamination may also be gaseous should there by any backstreaming of the vacuum pumping system between passes through the sputtering chamber.

Both forms of contamination reduce the adhesion at the coating interfaces in the final blank. Any adhesion loss, whether local or uniform, at any interface in the blank is a potential defect site in the final photomask. The rigorous processing steps of exposure, development, etching, stripping and numerous cleaning cycles, to which a blank is subjected in the manufacture of a photomask, enhance the likelihood that a given adhesion loss in a blank will generate a defect site in the photomask produced therefrom.

Another disadvantage of coating the masking layers in separate sputtering operations is the abrupt compositional interfaces between the layers. Such abrupt interfaces suffer from brittleness and poor adhesion. In addition, the layers of different composition etch at different rates during formation of the circuit pattern in the film thereby creating defects such as antireflective layer overhang, and rough line edge profile, in the etched pattern.

Efforts to eliminate the foregoing defects have focused on adding other layers to the opaque film and changing the composition of the light-blocking, chrome based layer and/or the antireflective layer. See, for example, U.S. Pat. No. 4,530,891 to Nagarekawa et al., U.S. Pat. No. 4,563,407 to Matsui et al. and U.S. Pat. No. 4,720,422 Shinkai et al.

A process approach to eliminating blank defects is disclosed by Nagarekawa et al. in U.S. Pat. No. 4,530,891. The Nagarekawa process uses the same chromium target to sputter a light-blocking chrome-carbide layer on the transparent substrate and an antireflective chrome oxide layer on the chrome-carbide layer. Deposition of the chrome-oxide layer follows in the same sputter chamber the deposition of the chrome-carbide layer. The different compositions of the layers are the result of charging the sputter chamber with different gas mixtures. First, the chamber is filled with a gas including methane and an inert gas to sputter the chrome-carbide layer. Then, the chamber is filled with a gas including oxygen and the chrome-oxide layer is deposited. Such a process would be expected to reduce contamination caused by movement of the blank substrate in the atmosphere. But, the abrupt composition interface is still a problem. And the Nagarekawa process is a batch process, requiring that the substrate sit stationary in the vacuum chamber during both sputtering steps and the change in gas mixture.

SUMMARY OF THE INVENTION

The invention is directed to a single pass, multiple target continuous coating process for making a photomask blank. The coating formed by the process contains strata of different composition and gradual compositional transitions between strata. The photomask blank product has low contamination, and good adhesion between the strata of different composition. Being a continuous process, production rates are higher. And the gradual compositional change in the coating results in fewer etch profile and spot defects in the ultimate photomask.

In a first aspect, the invention is directed to a process for making a photomask blank which comprises a transparent substrate and a masking layer on one surface of the substrate, said masking layer comprising strata of predetermined thickness and composition, the composition of the masking layer between the strata being a continuous gradient from the composition of one stratum to the composition of the next stratum, said process comprising the steps of:

providing means for continuously moving a transparent substrate at a predetermined rate through a vacuum chamber;

placing in the vacuum chamber a plurality of chrome-based targets arranged at intervals from a first target to a last target in the direction of substrate movement;

applying a predetermined electrical charge concurrently to each target to form a plasma of different composition simultaneously at each target, the targets being positioned at intervals such that the outer edge of the plasma at each target overlaps the outer edge of the plasma at each adjacent target; and moving the substrate through the vacuum chamber at said predetermined rate wherein the substrate contacts each plasma and plasma overlap region in turn from the plasma at the first target through the plasma at the last target.

In a further aspect, the invention is directed to a photomask blank comprising a transparent substrate and a masking layer on one surface of the substrate, said masking layer comprising:

a chrome-nitrogen rich stratum consisting essentially of 40-80 atomic % chromium, 5-45 atomic % nitrogen, 0-30 atomic % oxygen and 0-25 atomic % carbon, a chrome-oxygen rich stratum consisting essentially of 20-60 atomic % chromium, 10-50 atomic % oxygen, 5-45 atomic % nitrogen and 0-15 atomic % carbon, the oxygen content of the chrome-oxygen rich stratum being at least 20 atomic % greater than the oxygen content of the chrome-nitrogen rich stratum, and a transition region of 20-150 Angstroms thick bridging said strata, the composition of the transition region changing continuously and gradually from the composition of the chrome-nitrogen rich stratum to the composition of the chrome-oxygen rich stratum.

DESCRIPTION OF THE INVENTION

Figure 1:
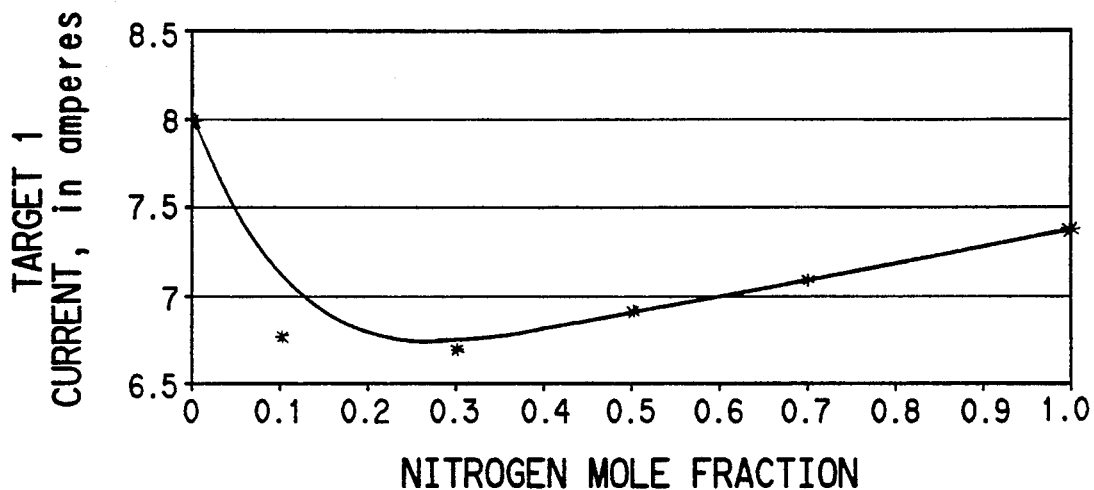
FIG. 1 is a graph of electrical direct current, in amperes, of the plasma over the first target versus nitrogen mole fraction in the plasma in an embodiment of the invention.

In the process of the invention, a single masking layer is deposited on a transparent substrate in a single pass, continuous deposition process. Conventional substrates comprising glass, such as quartz may be used. A conductive and transparent film of a material, such as indium oxide, stannic oxide and the like, may cover at least one surface of the glass. The substrate must be transparent to light in the wavelength region of the lithography process in which the final photomask product will be used. This wavelength region will be in the range of 190 to 900 nanometers, most often in the 350 to 600 nanometer range.

The masking layer is deposited on the substrate by reactive sputtering. Reactive sputtering is a coating process that takes place in a vacuum chamber. Within the vacuum chamber is a sputter chamber filled with a gas comprising inert gas and reactive gas under a predetermined pressure. A target comprising the material to be sputtered is positioned in the sputter chamber on an electrically conductive cathode. As a negative electrical potential is applied to the target, a plasma extending from the surface of the target is formed. The plasma comprises inert and reactive gas ions and species, and atomic units of the target. As the atomic target units travel through the plasma, they react with the reactive gas species therein to form various compounds. The compounds are deposited in a thin film or layer format on each substrate as it moves through the sputter chamber.

Inert gases suitable for this process include argon and xenon. Suitable reactive gases include nitrogen, oxygen, methane, and carbon dioxide. Pressure in the sputter chamber is usually in the range of $3.0 \times 10^{-2}$ to $9.0 \times 10^{-3}$ Torr. The target is typically a chrome based material such as chromium, chromium nitride, chromium carbide or chromium oxide.

I have found that multiple targets placed at intervals in the direction of substrate movement through the sputter chamber may be used simultaneously to deposit layers of different composition on the substrate in a single pass, continuous sputter process. By controlling the conditions within the sputter chamber, the composition of the plasma over each target and the plasma overlap between targets can be adjusted to deposit onto the moving substrate a single masking layer having strata of different compositions and inter-strata transitional regions wherein the composition gradually changes from the composition of one stratum to the composition of the next. Each stratum is functionally equivalent to the separate layers of prior art photomasks. Accordingly, the minimum number of targets employed on the process will directly correspond to the number of strata desired. Additional targets may be employed for example, is thicker transitional regions are desired. Anywhere from two to five targets is preferred, two to three targets being most preferred. The targets may be of the same or different material. Gas composition, pressure, target material, and desired composition of the stratum will determine the power applied to each target. Preferably, the targets are the same material and the composition of each stratum is varied by applying different levels of power to the respective targets.

Exemplary sputter chamber conditions for a process with two identical targets are set forth in Table 1. Note that the frequency of the applied electrical power to the targets is not limited to direct current but may also be radio frequency.

TABLE 1

| Substrate Travel Speed | 100 mm/min to 600 mm/min |
|---|---|
| DC Elec Power Target #1 | 1.0 kW–4.0 kW |
| DC Elec Power Target #2 | 0.5 kW–3.0 kW |
| Gas mixture based on flow at a constant pressure setting in above limits: | |
| Ar | 50 sccm–200 sccm |
| $O_2$ | 0 sccm–25 sccm |
| $N_2$ | 10 sccm–200 sccm |
| $CH_4$ | 0 sccm–25 sccm |
| $CO_2$ | 2.5 sccm–25 sccm |

Figure 2:
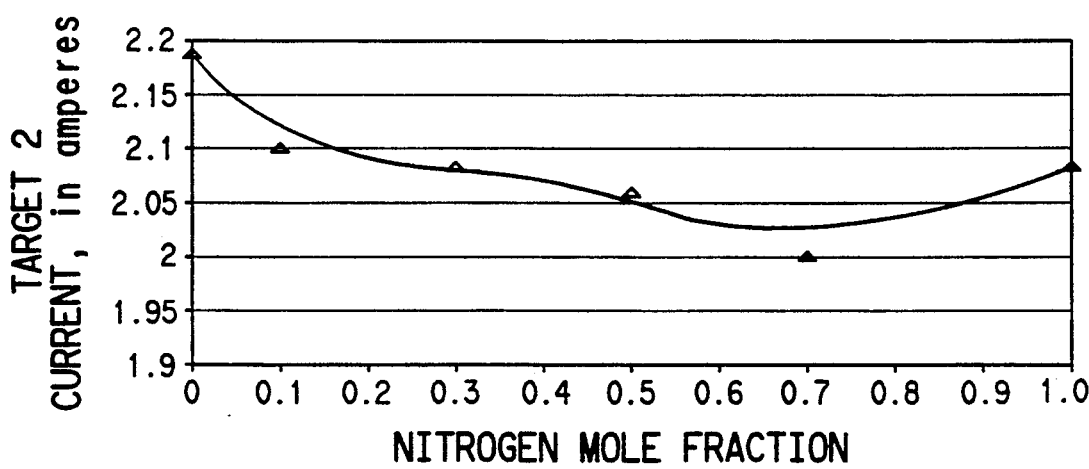
FIG. 2 is a graph of electrical direct current, in amperes, of the plasma over the second target versus nitrogen mole fraction in the plasma in the same embodiment of the invention as FIG. 1.

There are several ways of confirming the existence and determining the chemical and physical characteristics of the plasma compositional gradient in the space that spans the distance from the first target through the last target in the sputter chamber. One of these methods is to study the plasma current between the substrate and each target The plasma current is the determining factor for the sputtering rate of the target and formation of reactive species in the plasma. Accordingly, the gas composition of the plasma can be determined by studying the plasma current variations between plasma at different targets. One such study was performed to confirm the composition gradient of the plasma over the two chromium targets arranged in a sputter chamber under conditions of Table 1 such that the outer edges of the plasmas overlap. FIG. 1 shows the electrical direct current characteristics of the region of plasma over the first target as a function of nitrogen mole fraction where the oxygen to carbon dioxide ratio and the argon plus methane mole fraction is kept constant at a direct current power level of 3.4 kilowatts. FIG. 2 shows the plasma current characteristics for the second chromium target operating simultaneously in the same argon, nitrogen, oxygen, methane and carbon dioxide gas mixture. Despite both targets being the same composition, one can see that the plasma current characteristics in FIGS. 1 and 2 are indeed different from one another. Since both targets are operating in the same gas mixture, such difference is attributable to the creation of different gas species and sputtered chromium units at the atomic level. This is caused by the application of two different predetermined power levels to the two different targets.

Masking layers produced by the process of the invention comprise strata of predetermined thickness and composition and interstrata compositional gradients. The optical properties of these masking layers fall within industrial specifications of 2.5–3.5 optical density and <25% reflectivity in the 350 nm to 600 nm region of the spectrum. Yet, abrupt compositional interfaces and the attendant problems of low adhesion, overhang, rough line edge profile and chrome spot are reduced or eliminated. Contamination within the masking layer is also minimized.

The composition and thickness of the masking layer and each strata therein is readily controlled by the rate of substrate movement through the sputter chamber and the composition of the plasma therein. For example, a masking layer produced on a substrate in a single, continuous pass through a sputter chamber under the conditions in Table 1 comprises a chrome-and-nitrogen rich stratum next to the substrate, a transition region, and a top chrome-and-oxigen rich stratum.

The chrome-and-nitrogen rich stratum extends from the substrate surface for about 500–1500 Angstroms and contains 40–80 atomic % chromium, 5–45 atomic % nitrogen, 0–30 atomic % oxygen and 0–25 atomic % carbon; and the chrome-and-oxygen rich stratum extends from the top surface of the masking layer towards the substrate for about 50–350 Angstroms, and contains 20–60 atomic % chromium, 10–50 atomic % oxygen, 5–45 atomic % nitrogen and 0–15 atomic % carbon. The average oxygen content of the chrome-and-oxygen stratum is greater than the average oxygen content of the chrome-and-nitrogen rich stratum. Generally it is greater by 20–50 atomic % oxygen.

The transition region is usually about 20–150 Angstroms thick and its composition gradually changes from the composition of the chrome-and-nitrogen rich stratum to the composition of the chrome-and-oxygen rich stratum.

Total thickness of the masking layer is generally about 570–2000 Angstroms. As the distance from the substrate surface and the chrome-and-nitrogen rich stratum increases within the transition region, the gradual composition change typically comprises a chrome content decrease of about 0.25 to 0.80 atomic % per Angstrom, a nitrogen content decrease of about 0–0.53 atomic % per Angstrom, and an oxygen content increase of about 0.13–0.66 atomic % per Angstrom.

A photomask blank having these physical and chemical properties and manufactured by this method of reactive sputtering provides wet etch times in the range of 30 seconds to 100 seconds in a wet etchant solution of 1000 milliliters formed by adding deionized water to 165 grams of ceric ammonium nitrate and 42 milliliters of perchloric acid (70%) at 20° C.-21° C.

In a preferred embodiment, two chromium targets are positioned in a direct current planar magnetron sputtering device of the type known in the art. Each target is about six inches wide, twenty inches long and 0.25 inches high. The edge-to-edge distance between targets is about five inches. The sputter chamber is filled with a gas comprising argon, nitrogen, oxygen, carbon dioxide and methane. A polished glass substrate is moved through the sputter chamber under the conditions set forth in Table 2.

TABLE 2

| | |
|---|---|
| Operating Pressure | $2.8 \times 10^{-3}$ Torr |
| Substrate Travel Speed | 340 mm/min |
| DC Elec Power Target #1 | 2.85 kW |
| DC Elec Power Target #2 | 0.85 kW |
| Gas mixture based on flow at a constant pressure setting in above limits: | |
| Ar | 90 sccm |
| $O_2$ | 3.6 sccm |
| $N_2$ | 24 sccm |
| $CH_4$ | 3.5 sccm |
| $CO_2$ | 7.5 sccm |

Under these conditions, due to the light emission from the different species in the two different plasmas and the plasma overlap region, a color spectrum from bright blue over the first target changing to a bright pink over the second target is observed with the naked eye through the windows provided on the side of the process chamber, further confirming the existence of compositional gradient within the plasma in the direction of substrate movement.

Figure 3:
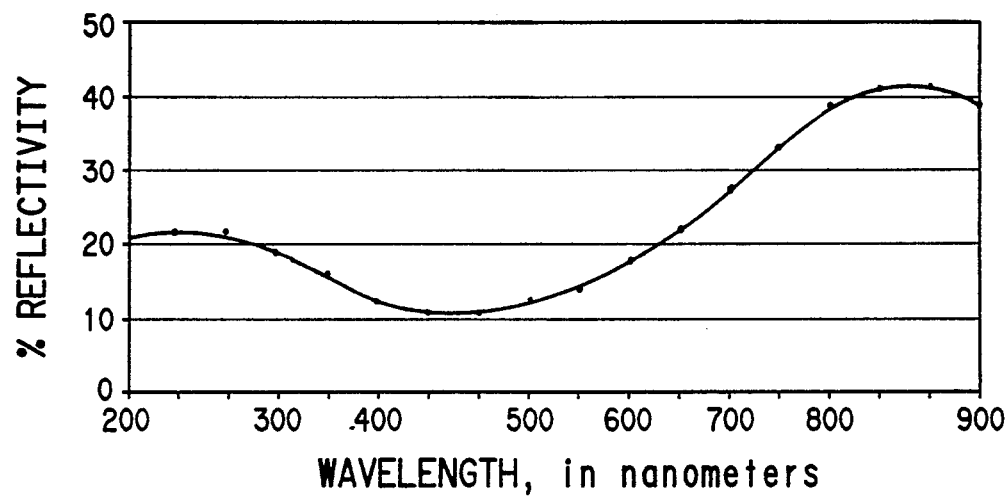
FIG. 3 is a graph of percent reflectivity versus wavelength of light, in nanometers, for a perferred masking layer of the invention.

The optical density of the masking layer produced under these preferred conditions is 2.8 to 3.2 when measured by an optical density meter with a blue filter. Reflectivity is <25% in the 350 nm to 600 nm region of the spectrum as shown in FIG. 3.

Figure 4:
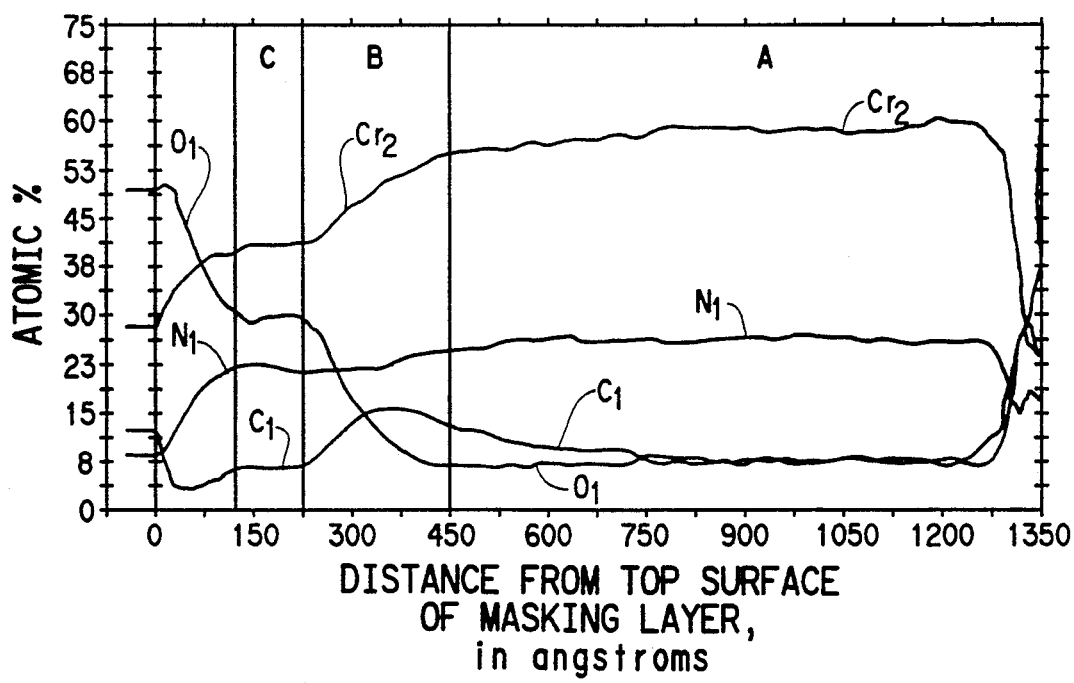
FIG. 4 is a graphical representation of the composition of a preferred masking layer of the invention.

The composition of the masking layer be analyzed by various methods. One such method, the Auger depth profiling technique, was performed to determine the two compositional strata and the compositional gradient between them in a photomask produced by the above preferred process. The technique analyzes the layer in terms of atomic percent as a function of distance from the top surface of the masking layer. The results are shown in FIG. 4.

As can be seen in this figure, the composition of the masking layer comprises a chrome-and-oxygen rich stratum (Area C), transition region (Area B) and a chrome-and-nitrogen rich stratum (Area A). The etch time of the blank obtained by the specific conditions given in Table 2 is about 50 sec.

While the invention has thus far been described in conjunction with some embodiments thereof, it is to be understood that those skilled in the art may practice the invention in various ways. For example, various combinations of targets and gas mixtures may be employed. If a thicker transition region (i.e. more gradual composition change) is desired in a two strata masking layer make by a two target process, a third target charged with an intermediate power may be added to the process. Alternatively, if a third stratum is desired, a third target may be added charged with the power appropriate to deposit the desired composition.

I claim:

1. A process for making a photomask blank which comprises a transparent substrate and a masking layer on one surface of the substrate, said masking layer comprising strata of predetermined thickness and composition, the composition of the masking layer changing gradually from the composition of one stratum to the composition of the next stratum, said process comprising the steps of:

providing means for continuously moving a transparent substrate at a predetermined rate through a sputter chamber;

placing in the sputter chamber a gas and a plurality of chrome-based targets arranged at intervals from a first target to a last target in the direction of substrate movement;

applying a predetermined electrical charge concurrently to each target to form a plasma of different composition simultaneously at each target, the targets being positioned at intervals such that the outer edge of the plasma at each target overlaps the outer edge of the plasma at each adjacent target; and moving the substrate through the sputter chamber at said predetermined rate wherein the substrate contacts each plasma and plasma overlap region in turn from the plasma at the first target through the plasma at the last target.

2. The process of claim 1 wherein the gas consists of a mixture of inert gas and reactive gas.

3. The process of claim 2 wherein the inert gas is selected from the group consisting of xenon and argon, and the reactive gas is selected from the group consisting of nitrogen, oxygen, carbon dioxide, methane and mixtures thereof.

4. The process of claim 3 wherein two targets are placed in the sputter chamber.

5. The process of claim 4 wherein the composition of the first target is the same as the composition of the second target.

6. The process of claim 5 wherein 1.0–4.0 kilowatts of power are applied to the first target and 0.5–3.0 kilowatts of power are applied to the second target.

7. A photomask blank comprising a transparent substrate and a masking layer on one surface of the substrate, said masking layer comprising:

a chrome-and-nitrogen rich stratum consisting essentially of 40–80 atomic % chromium, 5–45 atomic % nitrogen, 0–30 atomic % oxygen and 0–25 atomic % carbon, a chrome-and-oxygen rich stratum consisting essentially of 20–60 atomic % chromium, 10–50 atomic % oxygen, 5–45 atomic % nitrogen and 0–15 atomic % carbon, the oxygen content of the chrome-oxygen rich stratum being at least 20 atomic % greater than the oxygen content of the chrome-nitrogen rich stratum, and a transition region of 20–150 Angstroms bridging said strata, the composition of the transition region changing gradually from the composition of the chrome-and-nitrogen rich stratum to the composition of the chrome-and-oxygen rich stratum.

8. The photomask blank of claim 7 wherein the chrome-and-nitrogen rich stratum is 500–1500 Angstroms thick.

9. The photomask blank of claim 8 wherein the chrome-and-oxygen rich stratum is 50–350 Angstroms thick.

10. The photomask blank of claim 7 wherein the chrome content of the transition region decreases at a rate of 0.25–0.80 atomic % per Angstrom in the direction from the chrome-and-nitrogen rich stratum towards the chrome-and-oxygen rich stratum.; the nitrogen content of the transition region decreases at a rate of 0–0.53 atomic % per Angstrom in the direction from the chrome-and-nitrogen rich stratum towards the chrome-and-oxygen rich stratum.: and the oxygen content of the transition region increases at a rate of 0.13–0.66 atomic % per Angstrom in the direction from the chrome-and-nitrogen rich stratum towards the chrome-and-oxygen rich stratum.

* * * * *